United States Patent [19]
Gerardi et al.

[11] Patent Number: 5,219,797
[45] Date of Patent: Jun. 15, 1993

[54] METHOD OF TREATING A GALLIUM ARSENIDE SURFACE AND GALLIUM ARSENIDE SURFACE SO TREATED

[75] Inventors: Gary J. Gerardi, Wayne; Edward H. Poindexter, Holmdel; Fang Rong, Clarksburg, all of N.J.

[73] Assignee: The United States of America as represented by the Secretary of the Army, Washington, D.C.

[21] Appl. No.: 937,015

[22] Filed: Aug. 31, 1992

[51] Int. Cl.$^5$ ............................................. H01L 21/02
[52] U.S. Cl. ........................................ 437/238; 437/8; 437/107; 437/946; 148/DIG. 118; 148/DIG. 163; 148/33.3

[58] Field of Search ............... 437/238, 42, 946, 8; 257/56, 58, 62, 631, 632; 148/DIG. 118, DIG. 163

[56] References Cited

U.S. PATENT DOCUMENTS 3,655,438  4/1972  Sterling et al. ................... 117/201
3,867,216  2/1975  Jacob ................................... 156/2
4,065,781  12/1977  Gutknecht ........................ 357/23

*Primary Examiner*—Olik Chaudhuri
*Assistant Examiner*—H. Jey Tsai
*Attorney, Agent, or Firm*—Michael Zelenka; Roy E. Gordon

[57] ABSTRACT

A gallium arsenide surface is treated and made ready for passivation by exposing the gallium arsenide surface to silicon monoxide (SiO) vapor under a vacuum at about 450° C. for a short time.

2 Claims, No Drawings

METHOD OF TREATING A GALLIUM ARSENIDE SURFACE AND GALLIUM ARSENIDE SURFACE SO TREATED

GOVERNMENT INTEREST

The invention described herein may be manufactured, used and licensed by or for the Government for governmental purposes without the payment to us of any royalty thereon.

FIELD OF INVENTION

The invention relates in general to the art of treating a gallium arsenide surface and to the gallium arsenide surface so treated and in particular, to a method of treating a gallium arsenide surface to make it ready for passivation, and to the gallium arsenide surface so treated.

BACKGROUND OF THE INVENTION

GaAs devices have been unable to attain the full usefulness of Si-devices because the surface of GaAs has a high concentration of electrically harmful traps. A good GaAs surface passivation method would lead to a much improved GaAs based metal-insulator-semiconductor field effect transistor (MISFET). Thus, the benefits of FET Technology so widely exploited commercially in Si devices would become available for GaAs. A GaAs based MISFET would be faster than Si. In a second major area, GaAs microwave power MESFET Transistors would be vastly improved by reduction of inter-electrode surface leakage and breakdown.

Before one can passivate the GaAs surface, however, one must first prepare the surface for passivation by a priming or relaxing action.

SUMMARY OF THE INVENTION

The general object of this invention is to provide a method of preparing a GaAs surface for passivation. A more specific object of the invention is to provide a method of relieving the tension of a GaAs surface that has been tightly reconstructed. A still further object of the invention is to provide a method of treating a GaAs surface so that the surface will be amenable to the attachment of an insulating passivation film.

It has now been found that the aforementioned objects can be attained and a GaAs surface made ready for passivation by exposing the GaAs surface to a low concentration of silicon monoxide (SiO) vapor for a brief interval.

This SiO exposure allows a relatively few molecules of SiO (about a monolayer) to attach to the GaAs surface and relieve the surface tension by interrupting the surface atomic reconstruction. The GaAs surface is thus primed for adhesion and bonding of the main passivating material that is an insulating material otherwise tested and selected.

The essence of this invention, however, is the relief of surface tension and reconstruction by the controlled presence of a few SiO molecules. This relief is demonstrated first by the very large enhancement and change in character of the photoluminescence signal from the surface, due to reduction of harmful recombination processes. Second, by the emergence of an EPR (electron paramagnetic resonance) signal from near surface donors and lattice orbitals that are released when the reconstruction is broken, as in the case of the well-known $P_a$ and $P_b$ signals from the passivated Si surface. Subsequently applied insulating films can then attach firmly to the activated surface thereby giving a good passivation of the electrical defects residing on the GaAs surface.

In the aforedescribed method, by exposure for a brief interval is meant exposure for a short time of about 5 to 30 minutes. The time of exposure must just be sufficient for a monolayer of SiO to be deposited on the GaAs surface.

The temperature used in the method of the invention must be sufficient to vaporize the SiO but not too high as to introduce defects into the GaAs surface. A suitable operating temperature is generally 400 to 550 degrees C.

DESCRIPTION OF THE PREFERRED EMBODIMENT

The following method is used to prepare samples of crystalline GaAs that exhibit enhanced photoluminescence and a narrow-line EPR signal indicating that the sample is ready for passivation.

A $4 \times 20$ mm sample of GaAs is cut from semi-insulating GaAs wafers and treated with a solution of $H_2SO_4$:$H_2O_2$:$H_2O$ (4:1.1) for 30 seconds. The sample is then rinsed in D1 water and blown dry in $N_2$ gas. It is then loaded into a quartz ampoule along with a small quantity of SiO powder. The sample is sealed under vacuum of $10^{-4}$ to 1 Torr and placed in a furnace with the temperature set at 540° C. The ampoule is heated for about 30 minutes. The ampoule is then removed from the furnace and allowed to cool to room temperature. The GaAs sample is then removed from the ampoule and treated with HF:$H_2O$ (1:1) in order to remove any SiO adhering to the surface, and rinsed with DI water.

An alternate procedure for the preparation of GaAs samples exhibiting enhanced photoluminescence and a narrow EPR signal is as follows: The GaAs sample is etched in $H_2SO_4$:$H_2O_2$:$H_2O$ (4:1.1) for 30 seconds, then washed with DI water and blown dry in $N_2$ gas. The sample is placed in a quartz tube that is then evacuated to $10^{-4}$ Torr. The tube is back-filled with dry $H_2$ gas to a pressure of 1-torr. A Tesla coil is used to excite the $H_2$ gas to produce a plasma. The sample remains in the hydrogen plasma for 2 hours. The quartz tube is then sealed under vacuum of $10^{-4}$ Torr and placed in the furnace for 1 hour at about 450° C. The tube is then removed from the furnace and allowed to cool to room temperature. The sample is then removed from the tube with no further treatment. The alternate method in effect generates SiO by reaction of $H_2$ with the $SiO_2$ (quartz) which comprises the tube.

We wish it to be understood that we do not desire to be limited to the exact details of construction shown and described for obvious modification will occur to a person skilled in the art.

What is claimed is:

1. Method of treating a gallium arsenide surface to make it ready for passivation comprising exposing the gallium arsenide surface to silicon monoxide vapor under a vacuum of about $10^{-4}$ to 1 Torr for a short time of about 5 to about 30 minutes, wherein the time of exposure is that just sufficient to form a monolayer of silicon monoxide on the gallium arsenide surface and wherein the method is monitored by photoluminescence and electron paramagnetic resonance.

2. A gallium arsenide surface, ready for passivation, said gallium arsenide surface having a monolayer of silicon monoxide on the surface.

* * * * *